United States Patent
Fogel et al.

(10) Patent No.: US 8,642,378 B1
(45) Date of Patent: Feb. 4, 2014

(54) FIELD-EFFECT INTER-DIGITATED BACK CONTACT PHOTOVOLTAIC DEVICE

(71) Applicant: International Business Machines Corporation, Armonk, NY (US)

(72) Inventors: Keith E. Fogel, Hopewell Junction, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/718,748

(22) Filed: Dec. 18, 2012

(51) Int. Cl.
*H01L 31/00* (2006.01)
*H02N 6/00* (2006.01)

(52) U.S. Cl.
USPC ....... 438/98; 136/252; 136/258; 257/E31.124

(58) Field of Classification Search
None
See application file for complete search history.

(56) References Cited

U.S. PATENT DOCUMENTS

| | | | |
|---|---|---|---|
| 5,580,381 | A | 12/1996 | Yamagata |
| 7,816,236 | B2 | 10/2010 | Bauer et al. |
| 7,999,175 | B2 | 8/2011 | Nakayashiki et al. |
| 8,153,496 | B1 | 4/2012 | Ramappa |
| 8,202,789 | B2 | 6/2012 | Anella et al. |
| 2007/0235759 | A1 | 10/2007 | Henson et al. |
| 2008/0230116 | A1 | 9/2008 | Kannuo et al. |
| 2009/0215219 | A1 | 8/2009 | Ajiki et al. |
| 2010/0059109 | A1 | 3/2010 | Nakayashiki et al. |
| 2010/0186802 | A1 | 7/2010 | Borden |
| 2011/0041899 | A1 | 2/2011 | Josell et al. |
| 2011/0041902 | A1 | 2/2011 | Krokoszinski et al. |
| 2011/0041908 | A1 | 2/2011 | Harder |
| 2011/0056551 | A1 | 3/2011 | Kim et al. |
| 2011/0070681 | A1 | 3/2011 | Nakayashiki et al. |
| 2011/0120541 | A1 | 5/2011 | Cabarrocas et al. |
| 2011/0277833 | A1 | 11/2011 | Miller et al. |

OTHER PUBLICATIONS

Office Action mailed Dec. 17, 2013 for U.S. Appl. No. 13/748,222.

*Primary Examiner* — Zandra Smith
*Assistant Examiner* — Pamela E Perkins
(74) *Attorney, Agent, or Firm* — Tutunjian & Bitetto, P.C.; Louis J. Percello (57) ABSTRACT

A method for forming a photovoltaic device includes patterning a dielectric layer on a substrate to form a patterned dielectric having local spacings between shapes and remote spacings between groups of shapes, and depositing a doped epitaxial layer over the patterned dielectric such that selective crystalline growth occurs in portions of the epitaxial layer in contact with the substrate and noncrystalline growth occurs in portions of the epitaxial layer in contact with the patterned dielectric. First metal contacts are formed over the local spacings of the patterned dielectric, and second metal contacts are formed over the remote spacings. Exposed portions of the noncrystalline growth are etched using the first and second metal contacts as an etch mask to form alternating interdigitated emitter and back contact stacks.

20 Claims, 6 Drawing Sheets

FIELD-EFFECT INTER-DIGITATED BACK CONTACT PHOTOVOLTAIC DEVICE

RELATED APPLICATION INFORMATION

This application is related to commonly assigned co-pending U.S. patent application Ser. No. 13/032,866, filed on Feb. 23, 2011, and incorporated herein by reference in its entirety.

BACKGROUND

1. Technical Field

The present invention relates to photovoltaic devices, and more particularly to inter-digitated contact structures which increase efficiency.

2. Description of the Related Art

Inter-digitated back-contact (IBC) solar cell structures are of interest for increasing the short circuit current ($J_{sc}$) (and therefore efficiency) of the solar cells by forming both an emitter and back-surface-field (BSF) contacts on a backside of the solar cell. This permits sunlight to enter from a front side with minimum shadowing loss. In heterojunction solar cells, the emitter stack may be comprised of hydrogenated amorphous Si (a-Si:H) at the front side of the cells, whereas the emitter in homojunction solar cells is comprised of crystalline Si.

IBC heterojunction solar cells need to include a patterned emitter, and BSF amorphous Si stacks need to be properly aligned. This increases the complexity of fabrication and therefore the manufacturing cost. In addition, if lithography is employed for patterning a first stack, removal of residues resulting from the lithography, etching and/or removing the plasma etch damage to a substrate surface prior to the deposition of a second stack is difficult without damage to the first stack. Therefore the use of lithography and etching can compromise an interface between the substrate and the second stack, and as a result compromise the solar cell performance. Moreover, patterning of the second stack without damaging the first stack is difficult because dry or wet etch processes used for etching the second stack can generally etch the first stack at comparable etch rates.

SUMMARY

A method for forming a photovoltaic device includes patterning a dielectric layer on a substrate to form a patterned dielectric having local spacings between shapes and remote spacings between groups of shapes, and depositing a doped epitaxial layer over the patterned dielectric such that selective crystalline growth occurs in portions of the epitaxial layer in contact with the substrate and noncrystalline growth occurs in portions of the epitaxial layer in contact with the patterned dielectric. First metal contacts are formed over the local spacings of the patterned dielectric, and second metal contacts are formed over the remote spacings. Exposed portions of the noncrystalline growth are etched using the first and second metal contacts as an etch mask to form alternating interdigitated emitter and back contact stacks.

Another method for forming a photovoltaic device includes patterning a dielectric layer on a substrate to form a patterned dielectric having local spacings between shapes and remote spacings between groups of shapes; depositing a doped epitaxial layer over the patterned dielectric such that selective crystalline growth occurs in portions of the epitaxial layer in contact with the substrate and noncrystalline growth occurs in portions of the epitaxial layer in contact with the patterned dielectric; depositing a doped noncrystalline layer over the doped epitaxial layer; forming first metal contacts over the remote spacings; etching the doped amorphous layer in accordance with the first metal contacts; forming second metal contacts over the local spacings of the patterned dielectric; etching exposed portions of the noncrystalline growth using the first and second metal contacts as an etch mask to form alternating interdigitated emitter and back contact stacks.

A photovoltaic device includes a patterned dielectric formed on a substrate and having local spacings between shapes and remote spacings between groups of shapes. A doped epitaxial layer is formed over the patterned dielectric including selective crystalline growth in portions of the doped epitaxial layer in contact with the substrate and including noncrystalline growth in portions of the doped epitaxial layer in contact with the patterned dielectric. First metal contacts are formed over the local spacings of the patterned dielectric, and second metal contacts are formed over the remote spacings to form alternating interdigitated emitter and back contact stacks.

Another photovoltaic device includes a patterned dielectric formed on a substrate having local spacings between shapes and remote spacings between groups of shapes. A doped epitaxial layer is formed over the patterned dielectric including selective crystalline growth in portions of the doped epitaxial layer in contact with the substrate and including noncrystalline growth in portions of the doped epitaxial layer in contact with the patterned dielectric. A doped noncrystalline layer is formed over the doped epitaxial layer. First metal contacts are formed over the remote spacings, and second metal contacts formed over the local spacings of the patterned dielectric to form alternating interdigitated emitter and back contact stacks.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, an inter-digitated back-contact for photovoltaic devices employs a single patterning step rather than multiple patterning and alignment steps. The methods and devices provided herein may employ a low temperature epitaxial layer that provides high quality low temperature processing.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., GaInP, InGaAs or SiGe. These compounds include different proportions of the elements within the compound, e.g., InGaAs includes $In_xGa_yAs_{1-x-y}$, where x, y are less than or equal to 1, or SiGe includes $Si_xGe_{1-x}$ where x is less than or equal to 1, etc. In addition, other elements may be included in the compound, such as, e.g., AlInGaAs, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc. It is also to be understood that the present invention may include tandem (multi-junction) structures.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIGS. 1A-1D, a fabrication method is illustratively shown for forming an interdigitated back contact (IBC) 120 for a heterojunction photovoltaic device 100 in accordance with one illustrative embodiment. The disclosed method may provide an inter-digitated back-contact solar cell structure that employs a single patterning step rather than two or more patterning steps and eliminates, among other things, alignment steps typical for conventional processes.

Figure 1A:
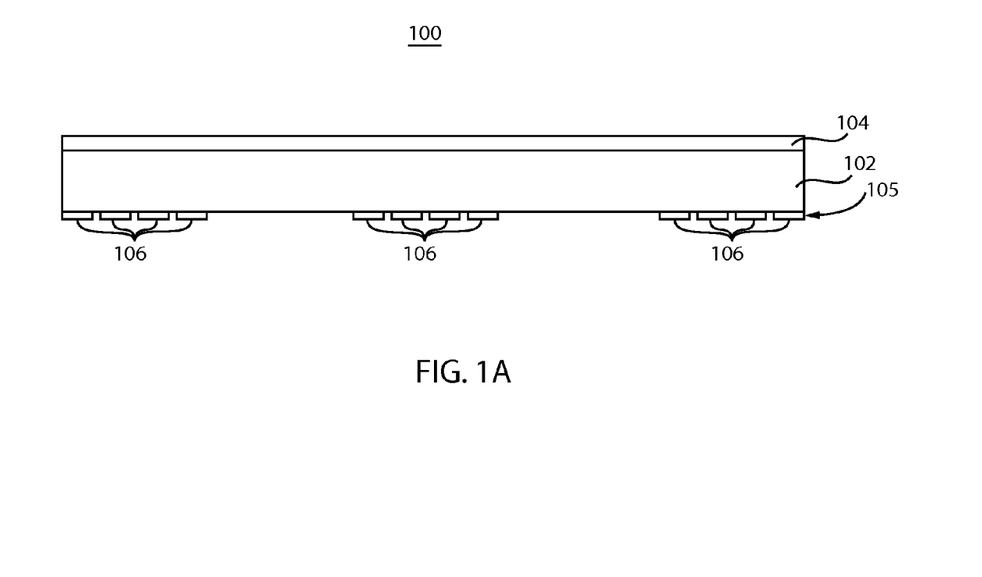
FIG. 1A is a cross-sectional view of a substrate having a front passivation/ARC layer and a back dielectric layer formed and patterned in accordance with the present principles.

Referring to FIG. 1A, an optional front-surface-field (FSF), passivation and/or anti-reflection coating (ARC) layer 104 is formed on a front side of a substrate 102. The substrate 102 preferably includes a crystalline (e.g., monocrystalline or multicrystalline) phase and may include Si, Ge, SiGe, SiC, a III-V material, etc. The passivation/ARC layer 104 may include silicon oxide, silicon nitride, silicon oxynitride or any other suitable material. A thin passivating dielectric layer 105 is deposited or grown and patterned to form a patterned passivation dielectric 106 on a backside of the substrate 102. The dielectric 106 may include but is not limited to silicon oxide, silicon nitride, aluminum oxide, hafnium oxide, etc. In some embodiments, the dielectric layer 106 may include a hydrogenated material. In still other embodiments, the dielectric layer 106 may be grown by plasma enhanced chemical vapor deposition (PECVD), by atomic layer deposition (ALD) or by other methods.

Figure 1B:
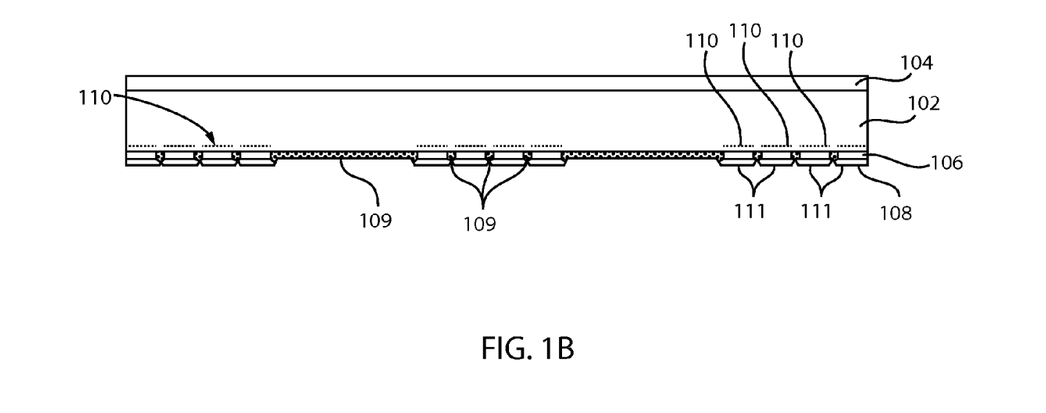
FIG. 1B is a cross-sectional view of the structure of FIG. 1A having a doped epitaxial layer formed on the back dielectric layer in accordance with the present principles.

Referring to FIG. 1B, in some embodiments, the dielectric layer 106 may include positive or negative charge accumulated at the bulk of the dielectric layer 106 or at an interface 110 between the dielectric layer 106 and the substrate 106. A highly-doped $n^+$ or $p^+$ Si (or SiGe) layer 108 is epitaxially deposited over the substrate 102 and the dielectric 106 on the back side of the device 100. In a particularly useful embodiment, a PECVD (or hot-wire chemical vapor deposition (HWCVD)) process is employed to selectively form a crystalline Si (or SiGe) layer 109 on top of exposed portions of the substrate 102 and a non-crystalline Si (or SiGe) layer 111 on top of the surface of dielectric 106.

The PECVD (or HWCVD) is preferable a low temperature process, which forms the epitaxial layer 108 that is grown selectively on exposed portions of the substrate 102 through spaces in the dielectric 106. The epitaxial layer 122 may be doped in-situ or by other methods. The epitaxial layer 108 may include a Si containing layer, a Ge containing layer, or combinations thereof. The epitaxially grown layer 108 results in non-crystalline material 111 on top of the dielectric 106, and crystalline material 109 on top of the substrate surface (in openings or spaces in the dielectric 106).

In particularly useful embodiments, the epitaxial layer 108 includes hydrogen content in the range of about 5-40% (atomic percent), and may include germanium (Ge), carbon (C), fluorine (F), deuterium (D), nitrogen (N) and combinations thereof. Non-crystalline refers to amorphous, nanocrystalline or microcrystalline, while crystalline refers to single crystalline or multicrystalline. The gas source providing Si for the epitaxial layer 122 may include silane ($SiH_4$), other gases such as disilane ($Si_2H_6$), dichlorosilane (DCS), tetrafluorosilane ($SiF_4$) or combinations thereof may be used as well. The gas source providing Ge for Ge containing layers may include germane ($GeH_4$). In-situ p-type doping may be performed using diborane ($B_2H_6$) or trimethylboron (TMB) sources, and in-situ n-type doping may be performed using a phosphine ($PH_3$) gas source, although other dopant sources may be used as well.

In one embodiment, the selective epitaxial growth of silicon is performed in a hydrogen diluted silane environment using PECVD. The gas ratio of hydrogen gas to silane gas ($[H_2]/[SiH_4]$) at 150 degrees C. is preferably between 0 to about 1000. In particularly useful embodiments, epitaxial growth of silicon begins at a gas ratio of about 5-10. The epitaxial Si quality is improved by increasing the hydrogen dilution, e.g., to 5 or greater.

Epitaxial silicon can be grown using various gas sources, e.g., silane ($SiH_4$), dichlorosilane (DCS), $SiF_4$, $SiCl_4$ or the like. The quality of epitaxial silicon improves by increasing the dilution of hydrogen using these or other gases. For higher hydrogen dilution, smoother interfaces were produced (epitaxial silicon to crystalline silicon) and fewer stacking faults and other defects were observed.

Radio-frequency (RF) or direct current (DC) plasma enhanced chemical vapor deposition (CVD) is preferably performed at deposition temperature ranges from about room temperature to about 400 degrees C., and preferably from about 150 degrees C. to about 250 degrees C. Plasma power density may range from about 2 $mW/cm^2$ to about 2000 $mW/cm^2$. A deposition pressure range may be from about 10 mTorr to about 5 Torr.

A carrier gas such as hydrogen ($H_2$), deuterium ($D_2$), helium (He) or argon (Ar) may be used for any or all of the layers. The carrier gas may be pre-mixed with the gas sources or flowed simultaneously with the gas source at the time of growth. The gas flow ratio is preferably $[H_2]/[SiH_4]>5$. For $P^{++}$ growth (n-type substrate), Ge may be included in the layer 108. In this case, the gas flow ratio is preferably $[H_2]/([SiH_4]+[GeH_4])>5$. The growth temperature for the epitaxial layer 108 may be less than about 400 degrees C. and more preferably between 150 and 250 degrees C., although higher or lower temperatures may be employed as well. Low-temperature epitaxial growth PECVD to passivate contacts preferably include in-situ doping of $n^{++}$ layer 108 (with an activated doping range of between about $10^{18}$ and about $3\times10^{20}$ $cm^{-3}$). The epitaxial layer 108 may include a thickness of between about 2 nm and about 100 nm, and preferably between 5 nm-25 nm.

The crystalline material 109 serves as a first contact region (e.g., an emitter or a back-surface-field (BSF) contact) while the non-crystalline material 111 induces charge of an opposite type (at or near interface 110 (i.e., the substrate-dielectric interface)) and serves as a second contact region (BSF or emitter) having a conductivity type opposite to that of the first contact region.

Figure 1C:
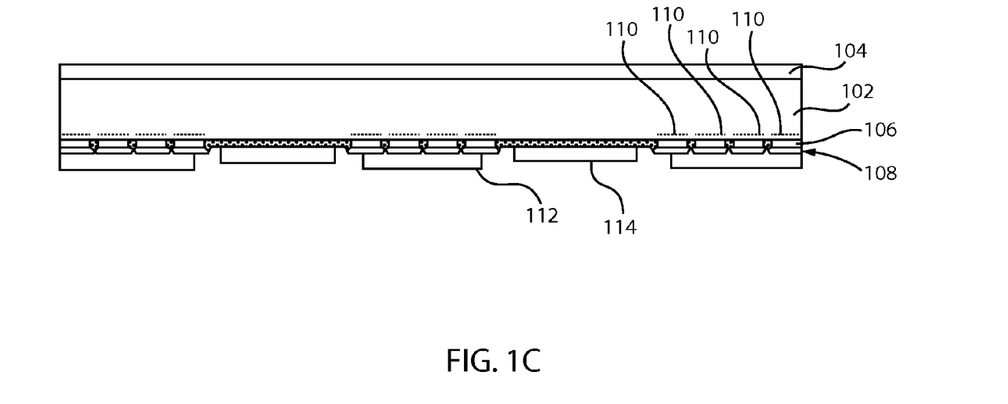
FIG. 1C is a cross-sectional view of the structure of FIG. 1B having metal contacts formed over the doped epitaxial layer in accordance with the present principles.

Referring to FIG. 1C, metal contacts or electrodes 112 and 114 are formed for the emitter and back surface contacts, respectively. The metal contacts 112, 114 may be formed from a single deposition process. For example, the metal contacts 112, 114 may be formed by screen printing, ink jet printing, lift-off processing or other patterned-as-deposited process. The metal contacts 112, 114 may include a transparent conductive material or an opaque material (metal), such as Al, Ag, Au, etc. Metal contacts are employed to mean metal or any other suitable conductive material including doped semiconductive material, conductive organic materials, conductive non-metals (e.g., carbon nanotubes), etc.

Figure 1D:
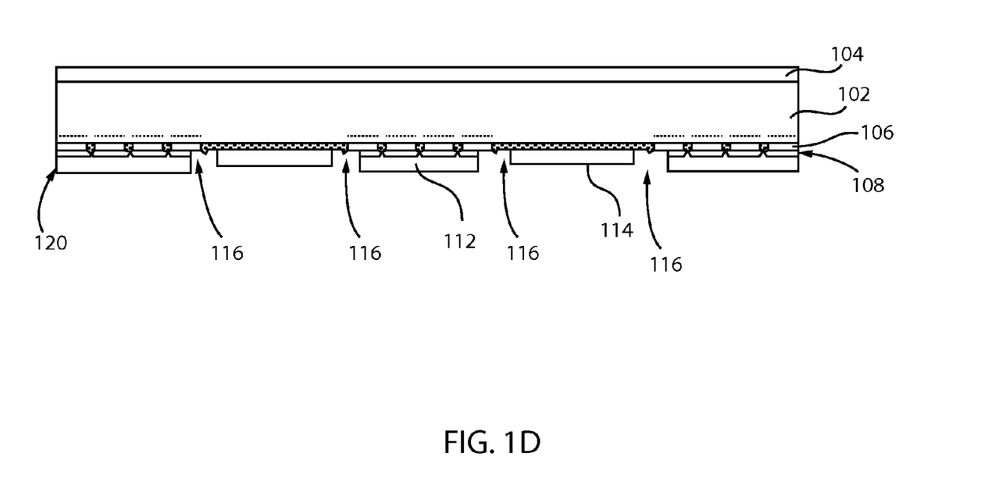
FIG. 1D is a cross-sectional view of the structure of FIG. 1C having metal contacts functioning as an etch mask to etch away noncrystalline portions of the doped epitaxial layer in accordance with the present principles.

Referring to FIG. 1D, a portion 116 of the non-crystalline Si (or SiGe) layer not masked by the metal electrodes is then removed selectively for example by hydrogen plasma or a wet chemistry (such as, a dilute HF or dilute HCl acid). This electrically separates the metal contacts 112 from the crystalline portion 109 below the metal contacts 114 for the emitter and BSF regions.

The non-crystalline layers 111 may be removed selectively, e.g., by an in-situ dry etch technique, e.g., using hydrogen plasma or other etching materials. A hydrogen plasma etch may be performed at, e.g., 150 degrees C. at 900 mTorr, resulting in an etch selectivity of approximately 1:3 for c-Si (crystalline material 109) with respect to a-Si:H (non-crystalline material 111). It should be understood that a non-epitaxial portion (amorphous Si) grown on insulator materials can be etched using gases such as, e.g., $H_2$, HCl, $Cl_2$, Ar, etc. The dry etch may include, e.g., a hydrogen plasma etch, as described; however, ex-situ removal of the non-crystalline material 111 may include employing a wet etch with a wet chemistry, such as, dilute HF, etc. Other plasma gases and wet etchants may also be employed.

Figure 2A:
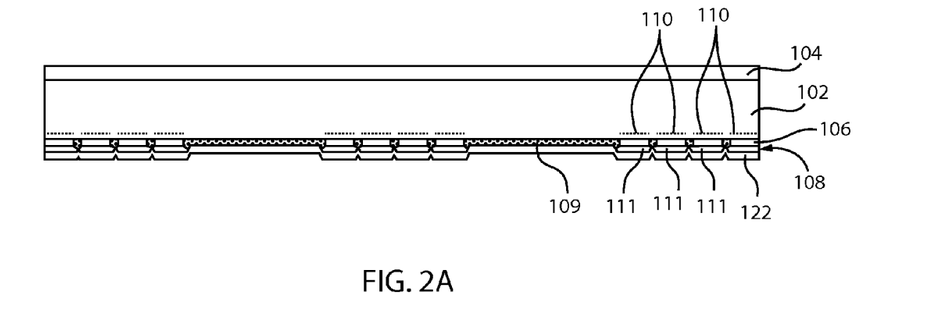
FIG. 2A is a cross-sectional view of the structure of FIG. 1B having an amorphous doped layer formed on the epitaxial layer in accordance with the present principles.

Referring to FIG. 2A, beginning with the structure depicted in FIG. 1B, in another embodiment, a doped layer 122 (e.g., a-Si:H) having a same conductivity type as that of the low-temperature epitaxial layer 108 is deposited on top of the low-temperature epitaxial layer 108. The doped layer 122 may be formed using a low-temperature deposition process, e.g., the PECVD process or HWCVD process described above.

Figure 2B:
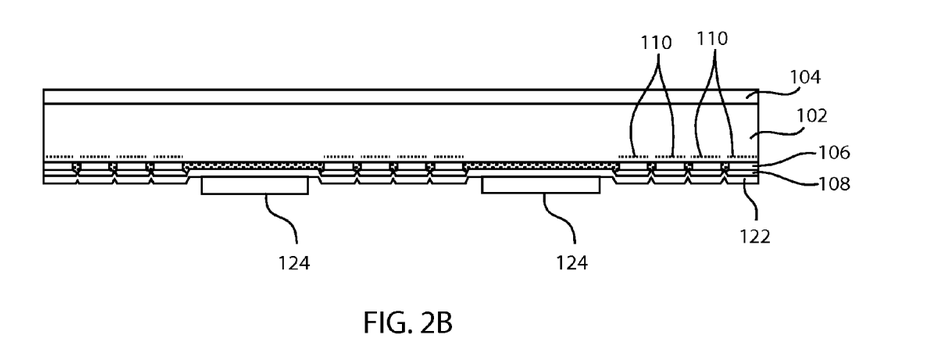
FIG. 2B is a cross-sectional view of the structure of FIG. 2A having first metal contacts formed over remote spacings between groups of shapes of the patterned dielectric in accordance with the present principles.

Referring to FIG. 2B, a first set of metal contacts 124 is formed, e.g., by screen printing or other as-placed deposition process. The metal contacts 124 are then employed as a mask to selectively remove portions of the doped layer 122. The metal contacts 124 may include a transparent conductive material or an opaque material (metal), such as Al, Ag, Au, etc.

Figure 2C:
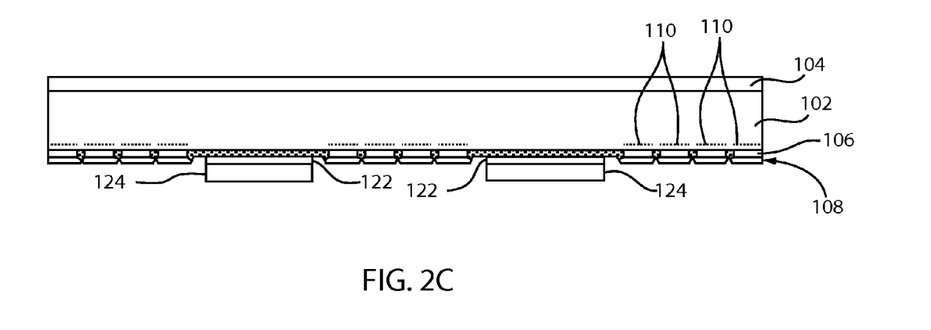
FIG. 2C is a cross-sectional view of the structure of FIG. 2B having first metal contacts acting as an etch mask to remove exposed portions of the doped amorphous layer in accordance with the present principles.

Referring to FIG. 2C, a selective etch is performed to remove exposed portions of the doped layer 122. The etching process may include a plasma etch (e.g., hydrogen plasma) or diluted acid etch (e.g., HF or HCl). In another embodiment, exposed portions of the noncrystalline material 111 of layer 108 may be removed or partially removed from over the dielectric 106. This additional portion may be removed concurrently during the removal of the exposed portions of the doped layer 122 described above using the metal contacts 124 as an etch mask. The results of etching this portion are not shown in the FIGS.

Figure 2D:
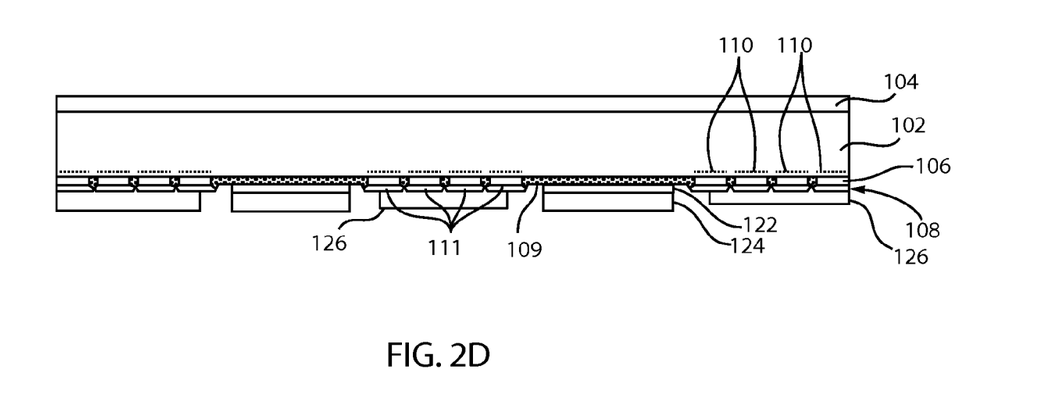
FIG. 2D is a cross-sectional view of the structure of FIG. 2C having second metal contacts formed over the doped epitaxial layer in accordance with the present principles.

Referring to FIG. 2D, a second set of metal contacts 126 are then formed, e.g., by screen printing, etc. as described above. The metal contacts 126 may include a transparent conductive material, an opaque material (metal), such as Al, Ag, Au, etc., or combinations thereof.

Figure 2E:
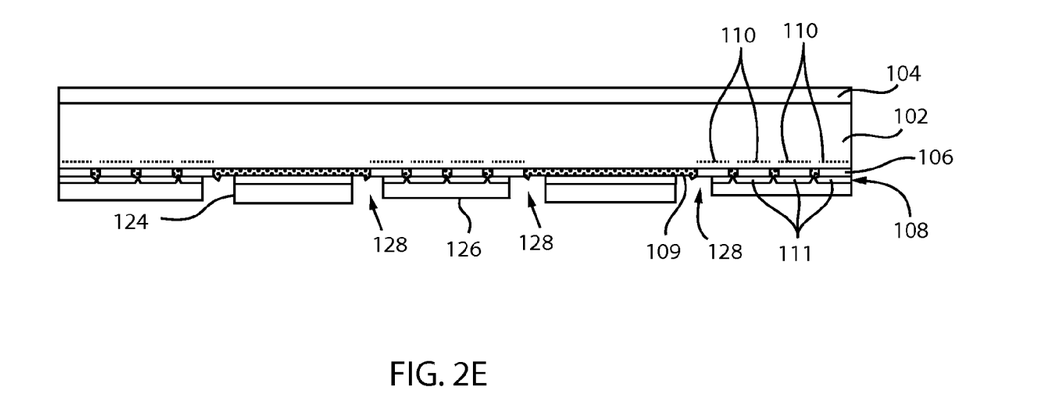
FIG. 2E is a cross-sectional view of the structure of FIG. 2D having the first and second metal contacts function as an etch mask to etch away noncrystalline portions of the doped epitaxial layer in accordance with the present principles.

Referring to FIG. 2E, the metal contacts 126 may also serve as a mask for selective removal of the noncrystalline material 111 of doped layer 108 on top of the dielectric 106 in regions 128. This etch may include, e.g., a hydrogen plasma etch or a wet chemistry etch (such as dilute hydrofluoric acid) as described above to electrically separate the emitter and BSF regions.

Figure 3A:
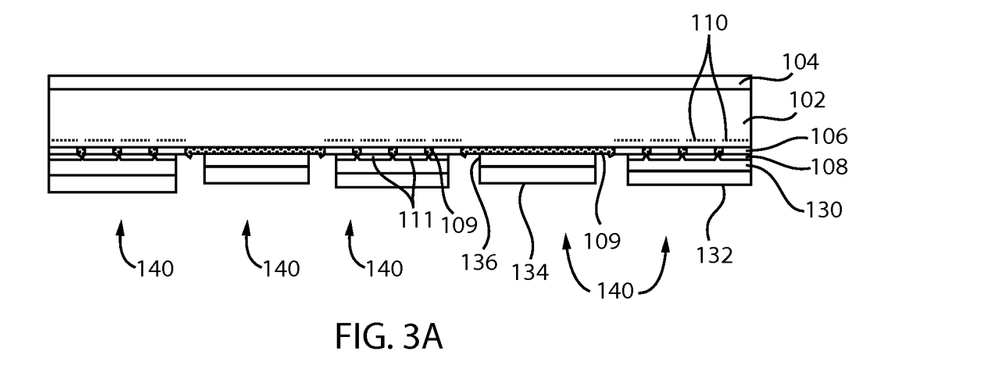
FIG. 3A is a cross-sectional view of the structure of FIG. 1D having transparent conductive material formed between the metal contact and the doped epitaxial layer in accordance with the present principles.
Figure 3B:
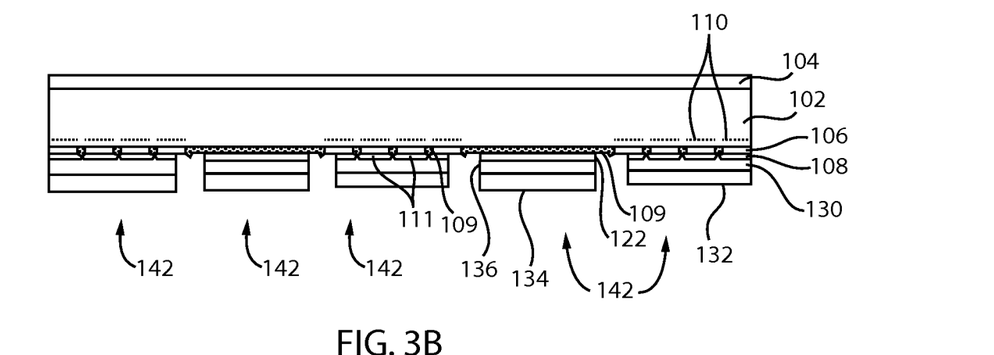
FIG. 3B is a cross-sectional view of the structure of FIG. 2E having transparent conductive material formed between the first metal contacts and the doped epitaxial layer and the second metal contacts and the doped amorphous layer in accordance with the present principles.

Referring to FIGS. 3A and 3B, in some embodiments, a transparent conductive material 130 and 136, such as a transparent conductive oxide (TCO) may be deposited and patterned using metal contacts 132 and 134. The material 130 and 136 is disposed between the metal contacts 132, 134 and the doped amorphous layer 122 (FIG. 3B) or the epitaxial layer 108 (FIG. 3A and FIG. 3B). The conductive material 130 and 136 may serve to improve reflection of light from the back surface and/or prevent the reaction of metal of contacts 132, 134 with the doped amorphous 122 or epitaxial 108 layers.

The conductive material 130 and 136 layer(s) may be deposited, e.g. by sputtering or CVD. The conductive material 130 and 136 may be patterned using the metal contact 132, 134 (which is formed after the formation of the conductive material 130 and 136 layer(s)) as an etch mask. The structure depicted in FIG. 3A shows the embodiment of FIG. 1D having conductive material 130 and 136 provided in interdigitated stacks 140. The structure depicted in FIG. 3B shows the embodiment of FIG. 2E having conductive material 130 and 136 provided in interdigitated stacks 142. Note that the embodiment corresponding to FIG. 3B employs two steps of conductive material deposition and etching. In some embodiments, TCO may be employed only for one set of the metal contacts (not shown).

Figure 4:
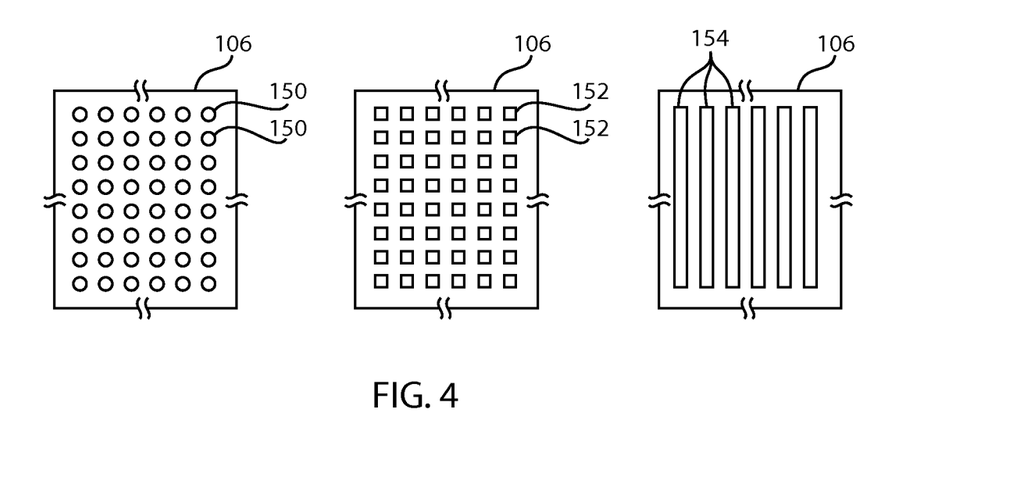
FIG. 4 shows three illustrative groups of shape patterns for forming the dielectric layer pattern in accordance with illustrative examples.

Referring to FIG. 4, the dielectric 106 shown throughout the FIGS. being patterned represents a single lithography process. The lithography process employed may use a mask or masks to generate different shapes or patterns or groups of shapes or patterns on the substrate 102. Openings may be formed in the dielectric 106 having any arbitrary shape such as circles 150, squares 152, lines 154, etc. as schematically depicted. An area fraction of the openings may be in the range of between about 0.1 and about 5%, although higher or lower fractions may be employed as well. The shapes depicted in FIG. may represent a local group of shapes. The shapes themselves may be spaced apart from one another by a local spacing (e.g., between shapes 150). The local groups of shapes may be repeated over the surface of the device. Spaces between these groups of shapes, which may be the same shape as the shapes or different from the shapes, are referred to as remote spacings.

Figure 5:
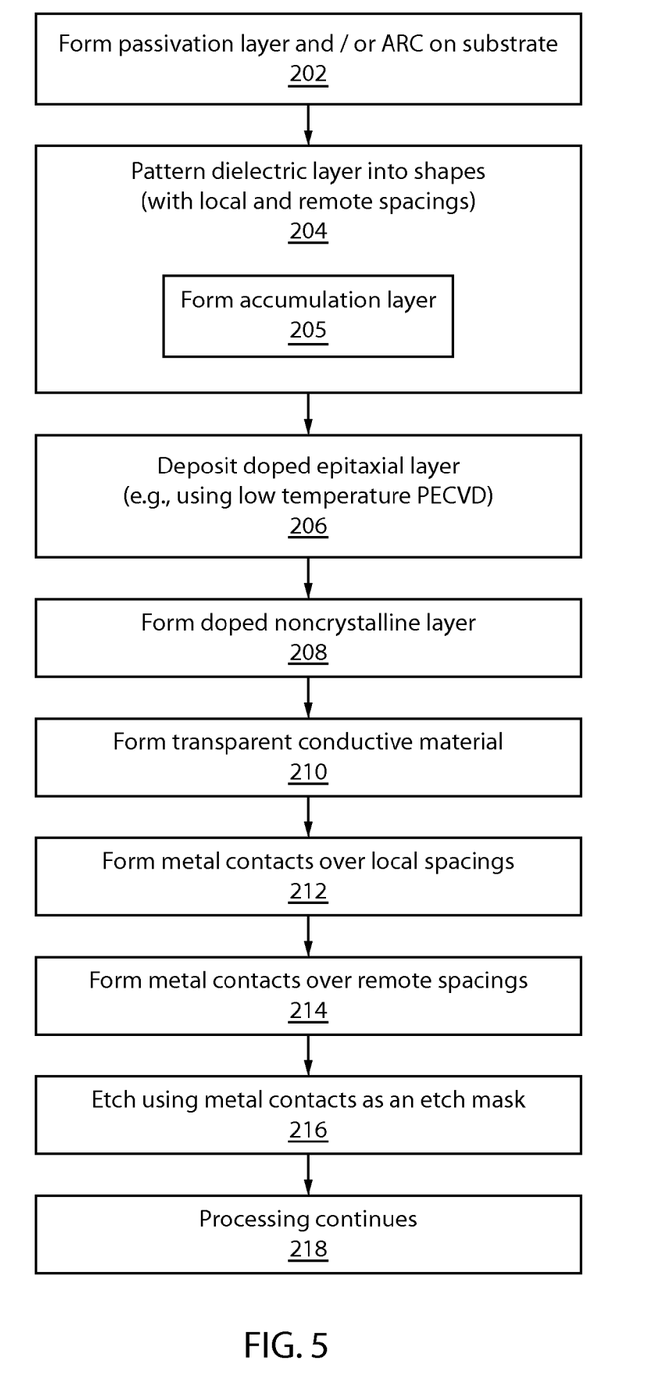
FIG. 5 is a block/flow diagram showing methods for fabricating photovoltaic devices in accordance with illustrative embodiments.

Referring to FIG. 5, a method for forming a photovoltaic device having interdigitated emitter/back contacts is shown in accordance with the present principles. The flowchart/block diagram in FIG. 5 illustrates the architecture, functionality, and operation of possible implementations of methods and devices according to various embodiments of the present invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, one or more of a passivation layer and an anti-reflection coating (ARC) may be formed on a front surface of a substrate. In block 204, a dielectric layer is patterned on the substrate (opposite the passivation/ARC layer) to form a patterned dielectric having local spacings between shapes and remote spacings between groups of shapes. The shapes and/or groups of shapes may include at least one of circles, squares, lines, etc. The patterning of the dielectric layer includes the only lithographic processing step employed to form alternating interdigitated emitter and back contact stacks in accordance with the present principles. In block 205, an accumulation of charge occurs at or near an interface between the patterned dielectric and the substrate.

In block 206, a doped epitaxial layer is deposited over the patterned dielectric such that selective crystalline growth occurs in portions of the epitaxial layer in contact with the substrate and noncrystalline growth occurs in portions of the epitaxial layer in contact with the patterned dielectric. The doped epitaxial layer may be formed by employing a plasma or hot wire chemical vapor deposition process having a temperature below 400 degrees C., and in particular at a temperature between 150 and 250 degrees C. with a gas ratio of $[H_2]/[SiH_4]>5$ for silicon growth or a gas flow ratio of $[H_2]/([SiH_4]+[GeH_4])>5$ for SiGe growth for Si or Ge containing layers.

In block 208, in one embodiment, a doped noncrystalline layer may be formed over the doped epitaxial layer. The noncrystalline layer may include amorphous, microcrystalline or nanocrystalline material.

In block 210, a transparent conductive material may be formed below the metal contacts. The transparent conductive material may be etched in accordance with the metal contacts.

In block 212, metal contacts are formed over the local spacings of the patterned dielectric on the epitaxial layer or the noncrystalline layer. In block 214, metal contacts are formed over the remote spacings on the epitaxial layer or the noncrystalline layer. In one embodiment, the metal contacts formed on the epitaxial layer may preferably all be formed in a same process. This process includes an as-deposited pattern deposition, such as a printing process, a lift-off process, etc. In another embodiment, when one set of metal contacts are formed on the doped noncrystalline layer, the metal contacts formed first are employed as an etch mask over the remote spacings to etch the doped noncrystalline layer in accordance with the metal contact. Then, the next set of metal contacts is formed over the patterned dielectric regions in a separate process.

In block 216, exposed portions of the noncrystalline growth are etched using the metal contacts as an etch mask. This forms alternating interdigitated emitter and back contact stacks. Processing may continue as needed in block 218.

Having described preferred embodiments for field-effect inter-digitated back contact photovoltaic device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
   patterning a dielectric layer on a substrate to form a patterned dielectric having local spacings between shapes and remote spacings between groups of shapes;
   depositing a doped epitaxial layer over the patterned dielectric such that selective crystalline growth occurs in portions of the epitaxial layer in contact with the substrate and noncrystalline growth occurs in portions of the epitaxial layer in contact with the patterned dielectric;
   forming first metal contacts over the local spacings of the patterned dielectric;
   forming second metal contacts over the remote spacings; and
   etching exposed portions of the noncrystalline growth using the first and second metal contacts as an etch mask to form alternating interdigitated emitter and back contact stacks.

2. The method as recited in claim 1, wherein patterning includes forming shapes and groups of shapes including at least one of circles, squares and lines.

3. The method as recited in claim 1, wherein the first metal contacts and the second metal contacts are formed in a same process.

4. The method as recited in claim 3, wherein the process includes providing the first metal contacts and the second metal contacts in an as-deposited pattern.

5. The method as recited in claim 1, further comprising accumulating charge at or near an interface between the patterned dielectric and the substrate.

6. The method as recited in claim 1, wherein depositing a doped epitaxial layer includes depositing the doped epitaxial layer by employing a plasma enhanced or hot wire chemical vapor deposition process having a temperature below 400 degrees C.

7. The method as recited in claim 1, wherein depositing a doped epitaxial layer includes depositing the doped epitaxial layer at a temperature between 150 and 250 degrees C. with a gas ratio of $[H_2]/[SiH_4]>5$ for silicon growth or a gas flow ratio of $[H_2]/([SiH_4]+[GeH_4])>5$ for SiGe growth.

8. The method as recited in claim 1, further comprising forming a transparent conductive material before forming the first and second metal contacts; and etching the transparent conductive material in accordance with the first and second metal contacts.

9. The method as recited in claim 1, wherein patterning a dielectric layer includes only one lithographic processing step employed to form the alternating interdigitated emitter and back contact stacks.

10. The method as recited in claim 1, further comprising forming one or more of a passivation layer and an anti-reflection coating on a front surface of the substrate opposite the alternating interdigitated emitter and back contact stacks.

11. A method for forming a photovoltaic device, comprising:
    patterning a dielectric layer on a substrate to form a patterned dielectric having local spacings between shapes and remote spacings between groups of shapes;
    depositing a doped epitaxial layer over the patterned dielectric such that selective crystalline growth occurs in portions of the epitaxial layer in contact with the substrate and noncrystalline growth occurs in portions of the epitaxial layer in contact with the patterned dielectric;
    depositing a doped noncrystalline layer over the doped epitaxial layer;
    forming first metal contacts over the remote spacings;
    etching the doped amorphous layer in accordance with the first metal contacts;
    forming second metal contacts over the local spacings of the patterned dielectric;
    etching exposed portions of the noncrystalline growth using the first and second metal contacts as an etch mask to form alternating interdigitated emitter and back contact stacks.

12. The method as recited in claim 11, wherein patterning includes forming shapes and groups of shapes including at least one of circles, squares and lines.

13. The method as recited in claim 11, wherein the first metal contacts and the second metal contacts are formed in an as-deposited pattern.

14. The method as recited in claim 11, further comprising accumulating charge at or near an interface between the patterned dielectric and the substrate.

15. The method as recited in claim 11, wherein depositing a doped epitaxial layer includes depositing the doped epitaxial layer by employing a plasma enhanced or hot wire chemical vapor deposition process having a temperature below 400 degrees C.

16. The method as recited in claim 11, wherein depositing a doped epitaxial layer includes depositing the doped epitaxial layer at a temperature between 150 and 250 degrees C. with a gas ratio of $[H_2]/[SiH_4]>5$ for silicon growth or a gas flow ratio of $[H_2]/([SiH_4]+[GeH_4])>5$ for SiGe growth.

17. The method as recited in claim 11, wherein depositing a doped noncrystalline layer includes depositing the doped amorphous layer by employing a plasma enhanced or hot wire chemical vapor deposition process having a temperature below 400 degrees C.

18. The method as recited in claim 11, further comprising forming a transparent conductive material before forming each of the first and second metal contacts; and etching the transparent conductive material in accordance with each of the first and second metal contacts to form a transparent conductive portion in contact with each of the first and second metal contacts.

19. The method as recited in claim 11, wherein patterning a dielectric layer includes only one lithographic processing step employed to form the alternating interdigitated emitter and back contact stacks.

20. The method as recited in claim 11, further comprising forming one or more of a passivation layer and an anti-reflection coating on a front surface of the substrate opposite the alternating interdigitated emitter and back contact stacks.

\* \* \* \* \*